United States Patent
Uchiyama et al.

(10) Patent No.: US 6,787,181 B2
(45) Date of Patent: Sep. 7, 2004

(54) CHEMICAL VAPOR DEPOSITION METHOD OF MAKING LAYERED SUPERLATTICE MATERIALS USING TRIMETHYLBISMUTH

(75) Inventors: Kiyoshi Uchiyama, Colorado Springs, CO (US); Narayan Solayappan, Colorado Springs, CO (US); Carlos A. Paz de Araujo, Colorado Springs, CO (US)

(73) Assignees: Symetrix Corporation, Colorado Springs, CO (US); Matsushita Electric Industrial Co., Ltd. (JP)

(*) Notice: Subject to any disclaimer, the term of this patent is extended or adjusted under 35 U.S.C. 154(b) by 411 days.

(21) Appl. No.: 10/007,119

(22) Filed: Oct. 26, 2001

(65) Prior Publication Data

US 2003/0080325 A1 May 1, 2003

(51) Int. Cl.[7] .................................................. B05D 5/12
(52) U.S. Cl. ........................... 427/99; 427/62; 427/124; 427/255.29
(58) Field of Search ........................... 427/99, 62, 124, 427/255.29, 255.28

(56) References Cited

U.S. PATENT DOCUMENTS

| | | | | |
|---|---|---|---|---|
| 5,314,866 A | * | 5/1994 | Berry et al. | 505/447 |
| 5,614,252 A | | 3/1997 | McMillan et al. | |
| 5,932,281 A | | 8/1999 | Hochido et al. | |
| 6,056,994 A | | 5/2000 | Paz de Araujo et al. | |
| 6,110,531 A | * | 8/2000 | Paz de Araujo et al. | 427/255.25 |
| 6,469,189 B1 | * | 10/2002 | Kadokura et al. | 556/28 |
| 6,660,874 B2 | * | 12/2003 | Shenai-Khatkhate et al. | 556/70 |

* cited by examiner

*Primary Examiner*—Bret Chen
(74) *Attorney, Agent, or Firm*—Patton Boggs LLP

(57) ABSTRACT

A method of forming a Bi-layered superlattice material on a substrate using chemical vapor deposition of a precursor solution of trimethylbismuth and a metal compound dissolved in an organic solvent. The precursor solution is heated and vaporized prior to deposition of the precursor solution on an integrated circuit substrate by chemical vapor deposition. No heating steps including a temperature of 650° C. or higher are used.

23 Claims, 3 Drawing Sheets

CHEMICAL VAPOR DEPOSITION METHOD OF MAKING LAYERED SUPERLATTICE MATERIALS USING TRIMETHYLBISMUTH

BACKGROUND OF THE INVENTION

1. Field of the Invention

This invention relates to a method of manufacturing a Bi (bismuth)-layered superlattice material using trimethylbismuth. This invention specifically relates to a method of forming with good reproducibility a Bi-layered superlattice material of a desired composition using trimethylbismuth.

2. Statement of the Problem

Recently, techniques for forming capacitance elements comprising superlattice materials having spontaneous polarization on a semiconductor integrated circuit have been developed in order to realize nonvolatile RAM (random access memory) which enables low operating voltage, high-speed writing and reading compared to conventional RAMs. A group of materials called Bi-layered superlattice materials are developed to be used for such a capacitance insulating film. This group of Bi-layered superlattice materials comprise complex oxides of metals, such as strontium, calcium, barium, bismuth, cadmium, lead, titanium, tantalum, hafnium, tungsten, niobium, zirconium, scandium, yttrium, lanthanum, antimony, chromium and thallium that spontaneously form layered superlattices, i.e. crystalline lattices that include alternating layers of distinctly different sublattices. Generally, each layered superlattice material will include two or more of the above metals; for example, strontium, bismuth and tantalum form the layered superlattice material strontium bismuth tantalate. These layered superlattice materials require a superlattice material generator element which is usually bismuth and is typically found in a precursor solution as bismuth oxide. A problem with many of the superlattice material generator elements is that a high vapor pressure at room temperature is required to reliably manufacture these layered superlattice materials. Another problem with present superlattice material generator elements is that they aren't thermally stable. Many bismuth generator compounds are easily decomposed when subjected to the operating conditions of the chemical vapor deposition (CVD) method. An additional problem with the processes for fabricating the layered superlattice materials, is that the prior art processes require a temperature of 800° C. or more sometime in the fabrication process. Generally, conventional integrated circuit components, such as CMOS components and wiring layers begin to deteriorate at temperatures higher than about 650° C., and the higher the temperature, the more rapid the deterioration. Thus, the high fabrication temperatures of the layered superlattice materials have prevented commercially viable high-yield processes from being developed.

SOLUTION

The above and other problems are solved and an advance in the art is made by a chemical vapor deposition method for making layered superlattice materials using trimethylbismuth in accordance with this invention. A first advantage of this invention is that the method provides, prior to chemical vapor deposition, a liquid precursor with a high vapor pressure even at room temperature. A second advantage of this invention is that the method provides, during chemical vapor deposition, a precursor vapor that is effectively vaporized. A third advantage of this invention is that the precursor vapor is stable at high temperature. Trimethylbismuth has a high vapor pressure at room temperature and it's decomposition temperature is higher than many of the present bismuth generator elements compounds. A fourth advantage of this invention is that the method provides chemical vapor deposition of Bi-layered perovskite materials with good reproducibility. A fifth advantage of this invention is that the substrate is annealed at a temperature below 650° C.

The invention provides a method of making a thin film layered superlattice material on an integrated circuit substrate using trimethylbismuth, the method comprising the steps of: dissolving the trimethylbismuth and a metal compound in a solvent to produce a final precursor liquid; forming a mist of the final precursor liquid with a carrier gas to produce a precursor mist; vaporizing the precursor mist to produce a precursor vapor; providing the integrated circuit substrate; applying the precursor vapor onto the substrate to produce the thin film superlattice material without any heating step that includes a temperature of 650° C. or higher; and completing the fabrication of the integrated circuit to include at least a portion of the thin film layered superlattice material in a component of the integrated circuit. Preferably, the step of dissolving the trimethylbismuth comprises mixing the trimethylbismuth with an organic solvent. Preferably, the metal compound comprises a metal polyalkoxide compound containing at least two metals selected from the group consisting of strontium, calcium, barium, cadmium, lead, tantalum, hafnium, tungsten, niobium, zirconium, bismuth, scandium, yttrium, lanthanum, antimony, chromium, molybdenum, vanadium, ruthenium and thallium. Alternatively, the metal compound comprises a diketonate compound containing at least two metals selected from the group consisting of strontium, calcium, barium, cadmium, lead, tantalum, hafnium, tungsten, niobium, zirconium, scandium, yttrium, lanthanum, antimony, chromium, molybdenum, vanadium, ruthenium and thallium. Preferably, the metal compound comprises an oxide compound containing at least two metals selected from the group consisting of strontium, calcium, barium, cadmium, lead, tantalum, hafnium, tungsten, niobium, zirconium, scandium, yttrium, lanthanum, antimony, chromium, molybdenum, vanadium, ruthenium and thallium. Preferably, the amount of trimethylbismuth is less than 15 mol %. More preferably, the amount of trimethylbismuth is less than 10 mol %. Most preferably, the amount of trimethylbismuth is 8 mol %. Preferably, the organic solvent comprises at least one compound selected from the group consisting of tetrahydrofuran, methyl ethyl ketone, isopropanol, methanol, xylene, n-butyl acetate, octane, 2-methoxyethanol, toluene, diethylethane, 1,4-dioxane and hexane. Preferably, the step of forming a mist of the precursor liquid comprises flowing the carrier gas across an open throat of a tube containing the precursor liquid, with the flow of the gas being substantially parallel to the open throat. Preferably, the method further includes a flowing oxygen gas into the deposition chamber reactor prior to the step of reacting. Preferably, the method further comprises at least one step of treating the thin film at temperatures below 650° C. to crystallize or partially crystallize the superlattice material in a phase including more grains with a high polarizability orientation than prior to the at least one step of treating, whereby the at least one step of treating is RTP, oxygen furnace annealing prior to formation of an electrode or contact to the layered superlattice material thin film, or an anneal after an electrode or other contact to the superlattice material thin film is formed. Preferably, the step of mixing the precursor mist comprises mixing the precursor mist with an inert carrier gas. Preferably, the carrier gas comprises at least one compound selected from the group consisting of nitrogen and argon. Preferably, the step of vaporizing comprises heating the precursor aerosol prior to the deposition step. Preferably, the step of heating further comprises heating the precursor aerosol to a temperature of from 50° C. to 250° C. Preferably, the step of heating further comprises heating the precursor aerosol to a temperature of from 100° C. to 200° C. Preferably, the step of providing the substrate further comprises placing the substrate inside a deposition chamber. In one preferred embodiment, the step of applying the precursor vapor comprises chemical vapor deposition. Preferably, the step of applying the precursor vapor further comprises deposition on a heated substrate. Alternatively, the step of applying the precursor vapor further comprises deposition on an ambient temperature substrate. Preferably, the thin film layered superlattice material is 1 nm to 100 nm thick.

The invention also provides a method of making a thin film layered superlattice material on an integrated circuit substrate using trimethylbismuth, the method comprising the steps of: dissolving the trimethylbismuth and a metal compound in a solvent to produce a precursor liquid, with the relative concentration of the trimethylbismuth to the solvent being 15 mol % or less; forming a mist of the precursor liquid with a carrier gas to produce a precursor mist; vaporizing the precursor mist to produce a precursor vapor; providing the integrated circuit substrate; applying the precursor vapor onto the substrate to produce the thin film superlattice material without any heating step that includes a temperature of 650° C. or higher; and completing the fabrication of the integrated circuit to include at least a portion of the thin film layered superlattice material in a component of the integrated circuit.

In another aspect the invention provides a precursor solution for forming a layered superlattice material, the precursor comprising trimethylbismuth and a metal compound in a solvent, with the relative concentration of the trimethylbismuth to the solvent being 15 mol % or less. Preferably, the metal compound comprises a metal polyalkoxide compound containing at least two metals selected from the group consisting of strontium, calcium, barium, cadmium, lead, tantalum, hafnium, tungsten, niobium, zirconium, bismuth, scandium, yttrium, lanthanum, antimony, chromium, molybdenum, vanadium, ruthenium and thallium. Preferably, the metal compound comprises a diketonate compound containing at least two metals selected from the group consisting of strontium, calcium, barium, cadmium, lead, tantalum, hafnium, tungsten, niobium, zirconium, scandium, yttrium, lanthanum, antimony, chromium, molybdenum, vanadium, ruthenium and thallium. Preferably, the metal compound comprises an oxide compound containing at least two metals selected from the group consisting of strontium, calcium, barium, cadmium, lead, tantalum, hafnium, tungsten, niobium, zirconium, scandium, yttrium, lanthanum, antimony, chromium, molybdenum, vanadium, ruthenium and thallium. Preferably, the amount of trimethylbismuth is 10 mol % or less. More preferably, the amount of trimethylbismuth is 8 mol %. Preferably, the solvent comprises at least one compound selected from the group consisting of tetrahydrofuran, methyl ethyl ketone, isopropanol, methanol, xylene, n-butyl acetate, octane, 2-methoxyethanol, toluene, diethylethane, 1,4-dioxane and hexane.

The present invention not only provides a more easily controlled process for making the layered superlattice materials, but also provides a method that is much more compatible with conventional integrated circuit processes. Other features, objects and advantages of the invention will become apparent from the following description when read in conjunction with the accompanying drawings.

DETAILED DESCRIPTION OF THE PREFERRED EMBODIMENT

Figure 1:
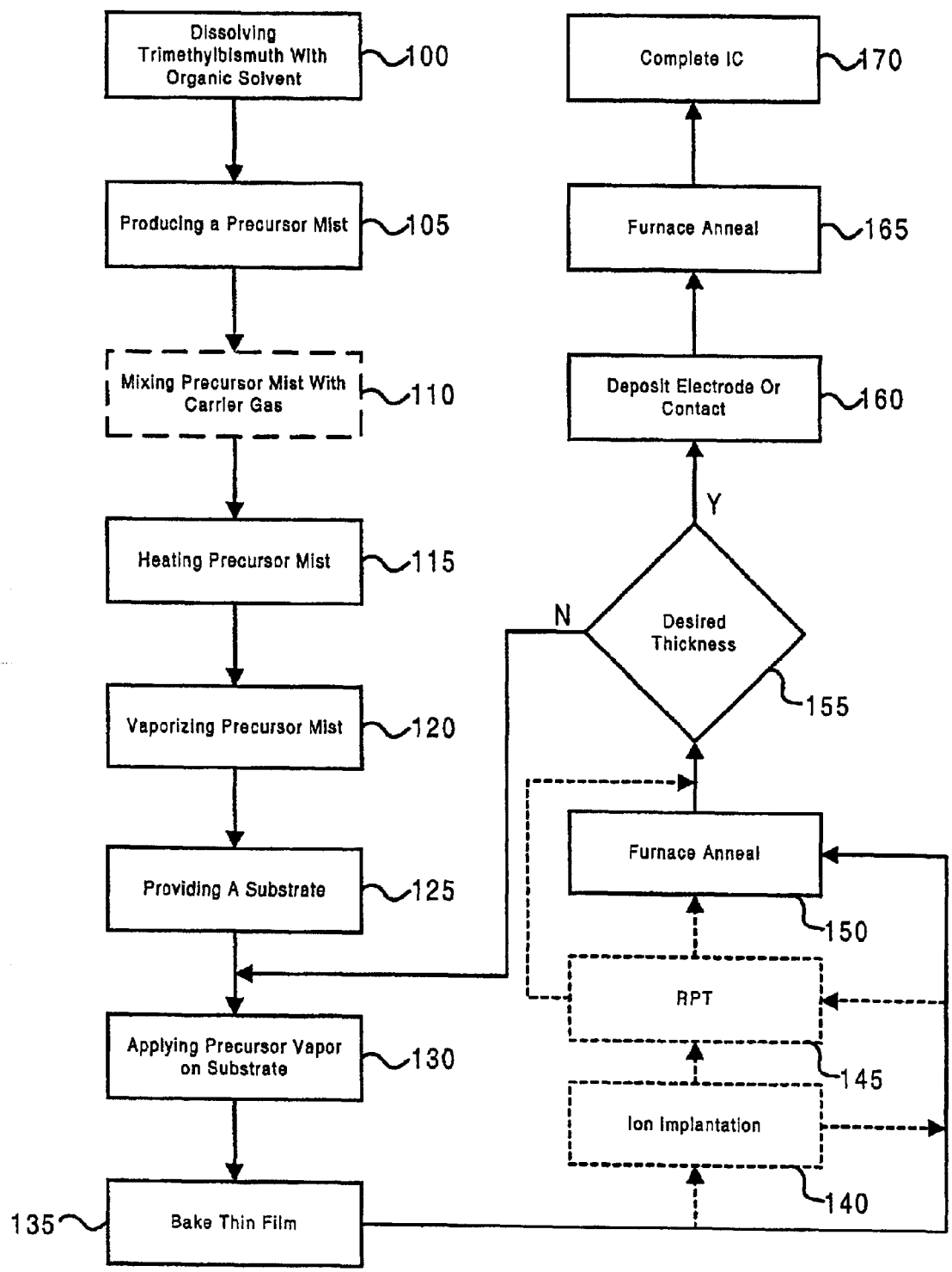
FIG. 1 is a flow chart showing the preferred embodiment of the CVD process according to the invention.

The term "thin film" herein means a thin film of a thickness appropriate to be used in an integrated circuit. Such thin films are less than 1 micron in thickness, and generally are in the range of 50 Å to 5000 Å. It is important to distinguish this term from the same term, i.e. "thin film" as used in essentially macroscopic arts, such as optics, where "thin film" means a film over 1 micron, and usually from 2 to 100 microns. Such macroscopic "thin films" are hundreds to thousands of times thicker than integrated circuit "thin films", and are made by entirely different processes that generally produce cracks, pores and other imperfections that would be ruinous to an integrated circuit, but are of no consequence in optics and other macroscopic arts.

The term "active", when applied to an electronic element in an integrated circuit, means an element that alters its state in response to some electrical stimulus. This is to distinguish elements that form important functions in the electrical circuit, and therefore must be of high, reproducible quality, and elements that are removed from the integrated circuit before its completion, which merely serve to separate portions of the circuit or act as a packaging element for the circuit, which elements do not need to be of nearly as high and reproducible quality.

As mentioned above, in the method of forming a Bi-layered superlattice material of this invention, the precursor solution was a mixture of trimethylbismuth compound, a metal polyalkoxide precursor and an organic solvent. In the literature, there is often some inconsistent use of such terms as "reagent", "reactant", and "precursor". In this application, the term "reagent" will be used to refer generally to a chemical compound or its derivative that reacts in the enclosed deposition chamber to form the desired thin film. The term "precursor" refers to a particular chemical formulation used in the method that contains a reagent. For example, a precursor may be a pure reagent in solid or liquid form, or it may be a liquid solution of one or more reagents in a solvent. Precursors may be combined to form other precursors.

Precursor liquids can generally include a metal compound in a solvent, such as sol-gel precursor formulations, which in general are comprised of metalalkoxides in an alcohol solvent, and metalorganic precursor formulations, sometimes referred to as MOD formulations. Metalorganic compounds can generally be categorized as β-diketonates, alkoxides or polyalkoxides, alkymetals and carboxylates.

Some examples of the β-diketonates metal compounds are 2,2,6,6-tetramethyl-3,5-heptanedionate (thd) and 2,4-pentanedionate also known as acetoacetonate (acac). β-diketonates metal compounds can be prepared by directly refluxing the respective β-ketones with lower alkoxides of the metal element in appropriate solvent. For example $Al(OC_2H_5)_3$ and $Al(i-OC_3H_7)_3$ react with acetylacetone in benzene-yielded trisderivatives.

Some examples of the alkoxides or polyalkoxides are ethoxide (OEth), isopropoxide (i-OPr), and butoxide (n-OBut). Metal alkoxides can be prepared by reactions of metal or metal chlorides with appropriate alcohols. Lower alkoxides can be converted to higher alkoxides by alcoholysis reactions carried out through dry-atmosphere reflux and distillations. The lower alkoxides evaporate first leaving behind the higher alkoxides. Some examples of alkylmetals are ethylzinc and phenylbismuth and some examples of carboxylates are benzoate and ethylbenzoate (eha). Carboxylates can be prepared by refluxing the carboxylic acid with lower alkoxides and subsequently distilling out the alcohols. An example of the formation of a metalcarboxylate is reacting 2-ethylhexanoic acid with a metal or metal compound in a solvent to form the appropriate metalcarboxylate.

These metal compounds are capable of containing the metal elements necessary for the layered superlattice material, such as strontium, calcium, barium, cadmium, lead, tantalum, hafnium, tungsten, niobium, zirconium, bismuth, scandium, yttrium, lanthanum, antimony, chromium, molybdenum, vanadium, ruthenium and thallium.

The trimethylbismuth precursor is stable; namely, it is not pyrolyzed or reacted with other substances under a vapor pressure required for forming thin film by CVD technique. The precursor solution contains trimethylbismuth, a metal compound and an organic solvent. When the precursor solution is vaporized according to the invention and formed on the substrate by the CVD technique, the precursor solution gases (trimethylbismuth gas, metal compound gas and organic solvent gas) supplied to the substrate surface reflect the element composition of the Bi-layered superlattice material, and thus, a Bi-layered superlattice material thin film of desirable composition can be formed with extremely good reproducibility.

In this invention, the trimethylbismuth is dissolved with a metal compound in an organic solvent to obtain a precursor solution, and the precursor solution is coated on a substrate. After that, the precursor solution is dried and sintered under an oxygen atmosphere in order to form a Bi-layered superlattice material thin film. As a result, the concentration of the trimethylbismuth will directly reflect the composition of the Bi-layered superlattice material, and thus, a Bi-layered superlattice material thin film of a desirable composition can be formed with extremely good reproducibility.

Trimethylbismuth can be easily synthesized, separated and refined. Trimethylbismuth vaporizes or sublimates in a relatively low temperature region (50° C. to 250° C.) to provide a vapor pressure (at least 0.01 Torr) required to be supplied into the thin film deposition chamber of a CVD device. In addition, trimethylbismuth is stable and does not decompose while it is supplied into the thin film deposition chamber of the CVD device, and then rapidly pyrolyzed on the substrate which is heated to 300° C. to 500° C.

In this invention, Bi-layered superlattice material thin film is formed from the trimethylbismuth. Some well-known film-forming methods, such as MOD, CVD, and sputtering exemplified in the conventional techniques, can be used. As mentioned above, CVD technique is preferred to form a thin film on a semiconductor integrated circuit substrate. The following operation is preferred: preparing a precursor solution by dissolving the trimethylbismuth compound with a metal compound in an organic solvent; coating the precursor solution on a substrate by a well-known thin film forming method, such as spincoating; drying the coating; and sintering the coating under an oxygen pressure.

The well-known CVD techniques used in this invention include normal pressure CVD, vacuum CVD, optical CVD and plasma CVD. Normal pressure CVD means that the precursor solution is pyrolyzed and deposited on the substrate under atmospheric pressure. In vacuum CVD, the same operation is carried out in a reduced pressure. In optical CVD, ultraviolet rays are irradiated to the pyrolitic atmosphere of the precursor solution gas in order to accelerate the growth reaction. In plasma CVD, the precursor solution gas is plasma-excited to accelerate the growth reaction when the precursor solution gas is pyrolyzed.

In this invention, the precursor solution is a liquid or solid state at room temperature, and it is reduced to an aerosol in the presence of an inert carrier gas, such as nitrogen or argon. The invention further reduces the precursor solution size from an aerosol to a vapor state by the addition of heat in a vaporization chamber prior to the well-known CVD technique. The term "vaporization" means the reduction in particle size of the precursor solution aerosol to a gas by heat below the critical temperature, so that the gas can be liquefied by compression without lowering the temperature.

In a typical CVD process, reagents necessary to form a desired material such as strontium bismuth tantalate are prepared, the reagents are vaporized, and the reagent vapors are fed into a deposition reactor containing a substrate, where they decompose to form a thin film of desired material on the substrate. The thin film and substrate are then treated by UV curing, evaporation in a vacuum, and/or baking, and then annealed to form a solid thin film of the desired material, such as strontium bismuth tantalate at a temperature below 650° C. As discussed above, the reagent vapors can be derived from solids that are heated to form a gaseous vapor by sublimation and from gases. While an aspect of the invention includes the fact that such solid and/or gaseous sources may be incorporated along with vapors that have liquid sources, to fabricate an integrated circuit material, the aspect of the invention that will primarily be discussed herein is the novel use of trimethylbismuth as a precursor solution component.

During a gasification process, it is usual to gasify each compound by forming masses of respective compounds (that is, containing every precursor material in a predetermined container). In an embodiment of the invention, it is preferable to dissolve the trimethylbismuth and the metal compound in the organic solvent to produce a precursor solution and to vaporize the precursor solution. According to this embodiment, a Bi-layered superlattice material thin film of a desired composition can grow by controlling the respective trimethylbismuth, metal polyalkoxide precursor and organic solvent concentrations during the preparation of the precursor solution, since the concentration ratio of the trimethylbismuth, metal compound and the organic solvent in the precursor solution directly reflects the mole ratio of the vaporized compounds. As a result, the Bi-layered superlattice material thin film composition can easily be controlled compared to a case where a Bi-layered superlattice material thin film is formed by gasifying each compound and controlling the supply of the respective gases into the deposition chamber.

The invention provides a method of making CVD precursors utilizing methoxides, ethoxides, butoxides, propoxides and other compounds with which CVD precursors may be made for almost any layered superlattice material.

The organic solvents used to dissolve the trimethylbismuth include tetrahydrofuran, methyl ethyl ketone, isopropanol, methanol, xylene, n-butyl acetate, octane, hexamethyldisilane (HMDS), 2-methoxyethanol, hexane, toluene, diethylethane, 1,4-dioxane and ethanol. Such solvents can be used alone or as a mixture thereof. An initiator, such as methyl ethyl ketone (MEK), may be added just before misting. A more complete fist of solvents and initiators as well as specific examples of metal compounds are included in U.S. Pat. No. 6,056,994 issued May 2, 2000 to Paz de Araujo et al. and U.S. Pat. No. 5,614,252, issued Mar. 25, 1997 to McMillan et al., which are hereby incorporated by reference to the same extent as if fully set forth herein. For the organic solvent, tetrahydrofuran can be used alone or in a mixture with at least one of the above-exemplified solvents in order to obtain a uniform solution since the trimethylbismuth dissolves well in the tetrahydrofuran, and thus, composition homogeneity of the Bi-layered superlattice material thin film is improved. It is preferable that the organic solvent contains tetrahydrofuran. Trimethylbismuth dissolves well into tetrahydrofuran and thereby allows for a homogeneous Bi-layered superlattice material composition to be provided.

In a preferred embodiment of the invention, the precursor solution is contacted with an inert carrier gas, such as nitrogen or argon, to reduce the particle size of the precursor solution from a liquid solution to an aerosol. An aerosol can include, but is not limited to, a mist or a gaseous suspension of ultramicroscopic particles of the precursor solution or precursor solid. The inert carrier gas is mixed with the precursor solution to produce a precursor aerosol. The precursor aerosol is then heated in a vaporization device to produce a precursor vapor that is then applied to the integrated circuit substrate by CVD.

FIG.1 is a flow chart showing the preferred embodiment of the CVD process according to the invention. Step 100 is the preparation step of dissolving the trimethylbismuth and the metal compound with the organic solvent. The organic solvent comprises at least one compound selected from the group consisting of tetrahydrofuran, methyl ethyl ketone, isopropanol, methanol, xylene, n-butyl acetate, octane, 2-methoxyethanol, toluene, diethylethane, 1,4-dioxane and hexane. Layered superlattice materials, such as strontium bismuth tantalate, are materials that spontaneously form into compounds having distinct layers. These compounds have a dual periodicity, which is the reason why they are termed "superlattices." Layered superlattice materials may be summarized generally under the formula:

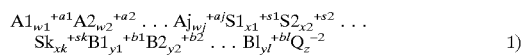

where A1, A2 . . . Aj represent A-site elements in the perovskite-like structure, which may be elements such as strontium, calcium, barium, bismuth, lead and others; S1, S2 . . . Sk represent superlattice generator elements, which usually is bismuth, but can also be materials such as yttrium, scandium, lanthanum, antimony, chromium, thallium, and other elements with a valence of +3; B1, B2 . . . Bl represent B-site elements in the perovskite-like structure, which may be elements such as titanium, tantalum, hafnium, tungsten, niobium, zirconium, and other elements; and Q represents an anion, which may be elements such as oxygen, fluorine, chlorine, and hybrids of these elements such as oxyfluorides, oxychlorides, etc. In this disclosure, we are primarily interested in the Bi-layered superlattice oxides, which include the materials in which Q is oxygen, as well as the hybrids that include oxygen. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $Sr_{0.75}Ba_{0.25}Bi_2Ta_2O_9$, on the average, 75% of the time Sr is the A-site atom and 25% of the time Ba is the A-site atom. If there is only one A-site element in the compound, then it is represented by the "A1" element and w2 . . . wj all equal zero. If there is only one B-site element in the compound, then it is represented by the "B1" element, and y2 . . . yl all equal zero, and similarly for the superlattice generators. The value of z is found from the equation:

$$(a1w1+a2W2 \ldots +ajwj)+(s1x1+s2x2 \ldots +skxk)+(b1y1+b2y2 \ldots +blbjyj)=2z \qquad 2)$$

The layered superlattice materials do not include every material that can be fit into the formula (1), but only those which spontaneously form themselves into crystalline structures with distinct alternating layers.

During CVD fabrication of layered superlattice materials, the vaporized metalorganic reagents should be prevented from being pyrolized or reacting with other substances prior to deposition. On the other hand, the reagents should pyrolyze rapidly and homogeneously once they reach the surface of the substrate. In order to achieve this objective, the invention provides a preferred method of depositing a Bi(bismuth)-generated layered superlattice thin film on a substrate in which trimethylbismuth and a metal compound are used as precursors. It is preferable in the technique that the metal compound is a metal polyalkoxide precursor represented by the following formula:

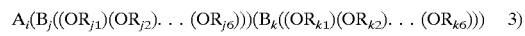

In this formula, $A_i$ is a cationic element and at least one simple substance or a mixture selected from the group consisting of Ba, Bi, Sr, Pb, La, and Ca. $B_j$ and $B_k$ are cationic elements that are identical or different from each other, and also simple substances or mixtures selected from the group consisting of Ti, Zr, Ta, Mo, W, and Nb. $R_{j1}$, $R_{j2}$, . . . $R_{j6}$, $R_{k1}$, $R_{k2}$, . . . $R_{k6}$ are alkyl groups having carbons from 1 to 12. The metal alkoxide compound represented by formula (3) contains two or three kinds of metal elements, and thus, a Bi-layered superlattice material can be formed from the metal alkoxide compound and trimethylbismuth. Examples of metal elements ($A_i$) in the metal alkoxide precursor are Group IIA elements, including Sr and Ba, and Group IA elements, including Na and K, and Pb. Examples of the metal elements ($B_j$, $B_k$) are Fe, Ti, W, and Group Va elements, including Nb and Ta. The alkyl groups of the alkoxy groups ($OR_{j1}$, $OR_{j2}$). . . ($OR_{j6}$, $OR_{k1}$, $OR_{k2}$, . . . $OR_{k6}$) in formula (3) contained in the metal compound precursor are typically alkyl groups having carbon atoms from 1 to 5, more specifically, methyl groups, ethyl groups, isopropyl groups, tertiary butyl groups, and isopentyl groups. The six groups that coordinate with the metal elements ($B_j$, $B_k$) can be one kind, different from each other, or be classified in from two to five of the groups mentioned in the preceding sentence.

It is preferable that $A_i$ of the alkoxide group represented by formula (3) is Sr or Ba, $B_j$ is Nb or Ta, and $B_k$ is Nb or Ta, so that the obtained Bi-layered superlattice material has excellent characteristics as a capacitance insulating film for a nonvolatile memory.

The following compounds are examples of the preferred metal compound reagents suited for CVD deposition:

(1) $Sr(Ta(OiPr)_6)_2$
(2) $Sr(Nb(OiPr)_6)_2$
(3) $Ba(Ta(OiPr)_6)_2$
(4) $Ba(Nb(Oipr)_6)_2$
(5) $Sr(Ta(OiPr)_6)(Nb(OiPr)_6)$
(6) $Ba(Ta(OiPr)_6)(Nb(OiPr)_6)$
(7) $Sr(Ta(OiPr)_3(OEt_3)_2$
(8) $Sr(Ta(OiPr)_3(OEt_3)(Ta(OiPr)_2(OEt_4)$
(9) $Sr(Ta(OEt)_6)_2$
(10) $Sr(Nb(OEt)_6)_2$
(11) $Ba(Ta(OEt)_6)_2$
(12) $Ba(Nb(OEt)_6)_2$ In these examples, Et indicates an ethyl group and iPr indicates an isopropyl group. In this invention, one or plural kinds of metal compounds can be easily synthesized, separated, and refined. They gasify in a relatively low temperature region (130° C. to 230° C.) to provide a vapor pressure (at least 0.1 Torr) required in the CVD process.

The mole ratios of the trimethylbismuth, metal compound and the organic solvent can be produced by an individual flow controller connected to a trimethylbismuth storage container, a metal compound storage container and an individual flow controller connected to the organic solvent storage container. These storage containers are up-line or before the precursor solution mixing device. Also, the mole ratios of the trimethylbismuth, metal compound and organic solvent can be measured with other measuring devices such as volumetric glassware or other conventional methods known in the art for precisely measuring volumes of liquids or solids prior to mixing.

It is preferable that the precursor composition comprises less than 15 mole percent of the trimethylbismuth with the balance of the mole percent comprising the metal compound and the organic solvent. It is more preferable that the precursor composition comprises less than 10 mole percent of the trimethylbismuth with the balance of the mole percent comprising the metal compound and organic solvent. It is most preferable that the precursor composition comprises 8 mole percent of the trimethylbismuth and 92 mole percent of the metal compound and organic solvent. Once the trimethylbismuth, metal compound and organic solvent are mixed in to the desired mole ratio, the mixture of trimethylbismuth, metal compound and organic solvent is then stored in a storage container. The storage containers can be heated or unheated depending on the physical state and desired temperature of the trimethylbismuth, metal compound and the organic solvent. Step 105 produces a precursor mist from said precursor solution by reducing the precursor solution particle size of several microns or less. The term "mist" as used herein is defined as fine drops of a liquid carried by a gas. This precursor solution particle size reduction takes place in an atomizer. The atomizer is a device that is well-known in the art that produces a mechanical subdivision of the precursor solution, as by spraying, sprinkling, misting or nebulizing. The atomizer preferably comprises a venturi mister. The venturi mister includes a horizontal gas passage and a vertical liquid passage or tube which connects to the horizontal fluid passage. A mist is formed in the venturi by flowing carrier gas in the horizontal passage across the open throat of the vertical tube containing the precursor liquid, with the flow of the gas being substantially parallel to the open throat. The size of the passages is preferably from about ¼ millimeter to 2 millimeters in diameter. A detailed example of the venturi mister is given in U.S. Pat. No. 6,110,531 issued Aug. 29, 2000 to Paz de Araujo et al., which is incorporated herein by reference. The preferred method follows the solid lines in FIG. 1, while the dotted lines indicate alternative or optional steps. Step 110 is an optional step of introducing an inert carrier gas to the precursor mist to produce a precursor aerosol. The term "aerosol" is generally defined as a colloidal suspension of solid or liquid particles in a gas. Herein, the term "aerosol" is intended to include all the suspensions included in the text *Aerosol Science and Technology*, by Parker C. Reist, McGraw-Hill, Inc. New York, 1983, which is hereby incorporated by reference. The term "mist" as used herein is intended to be broader than the term "aerosol", and includes suspensions that may not be included under the terms "aerosol" or "vapor". Step 110 is optional, where step 105 is sufficient to reduce the precursor solution size to an aerosol prior to step 115 of heating the precursor aerosol. An inert carrier gas, such as nitrogen or argon, is supplied outside of the storage tanks and is introduced into the precursor mist prior to vaporization step 120.

Vaporization step 120 heats the precursor aerosol to produce a precursor vapor. A vapor means, but is not limited to, a gas at a temperature below the critical temperature, whereby it can be compressed to a liquid without lowering the temperature. Vaporization step 120 takes place at a temperature of between 50° C. and 250° C. Preferably, vaporization step 120 takes place at a temperature of between 100° C. to 200° C. A detailed example of the vaporization is given in U.S. Pat. No. 6,110,531, which is incorporated herein by reference. The critical temperature means the temperature of the liquid-vapor critical point; that is, the temperature above which the substance has no liquid-vapor transition. In step 125, a substrate is provided. In the art, the term "substrate" is used both in a general sense in which it may be any one or a number of layers of material on which a layer of interest is deposited, and in a special sense in which it denotes a silicon wafer on which an integrated circuit is formed. Preferably, the substrate is placed in an enclosed deposition chamber to form a thin film of the precursor vapor. Unless the context indicates otherwise, the term "substrate" herein will indicate any object on which a layer of material is deposited using the process and apparatus of the invention. The substrate referred to as being provided in step 125 preferably comprises a P-type silicon wafer. In step 130, the gasified precursor vapor is controlled by flow controllers and is uniformly deposited on the integrated circuit substrate. The precursor vapor is flowed through the deposition chamber to form a thin film of precursor vapor on the substrate. Preferably, deposition step 130 takes place in the enclosed deposition chamber at a temperature of from 300° C. to 500° C., the exact temperature depending on the material to be formed. The pressure in the enclosed deposition chamber is preferably between 1 milliTorr and 850 milliTorr. The superlattice material thin film that is deposited in step 130 contains all the metal elements of the desired Bi-layered superlattice material thin film and generally contains most but not all of the oxygen necessary to form the final desired material. It also may contain other organics from the precursor. It may be in an amorphous form, in a partially crystallized form, or in a form with a different crystallization than the final form desired. The vapor pressures of the individual precursor vapors depends on the precursor and will be discussed below in connection with the precursors. A detailed example of the deposition step is given in U.S. Pat. No. 6,110,531, which is incorporated herein by reference. The vapor is flowed across the substrate via multiple input ports and exits the deposition chamber area via exhaust ports, with the ports being distributed in close proximity to and about the periphery of the substrate to create a substantially evenly distributed flow of mist across the substrate. In step 135, the substrate is baked to grow the ferroelectric thin film. The precursor vapor is thermally treated to form a solid metal oxide having a mixed layered superlattice structure. This treating step is conducted by drying and baking the result of step 130. In step 135, the precursor vapor is dried on a hot plate in a dry air atmosphere and at a temperature of from about 200° C. to 500° C. for a sufficient time duration to remove substantially all of the organic materials from the liquid thin film and leave a dried metal oxide residue. The period of time is preferably from about one minute to about thirty minutes. A 400° C. drying temperature for a duration of about two minutes to ten minutes in air is most preferred. This high temperature drying step is essential in obtaining predictable or repeatable electronic properties in the crystalline compositions to be derived from step 135. In step 140, optionally, an ion implantation step may be performed prior to the RTP step 145 or furnace anneal step 150 to create crystallization sites. The ion implantation step 140 preferably employs implantation with argon, helium, oxygen or similar ions. This step creates additional nuclei for growing grains with mixed orientation. The RTP step 145 promotes nucleation, i.e. the generation of numerous small crystalline grains of layered superlattice material of mixed orientation in the solid film. These grains act as nuclei upon which further crystallization can occur. The oxygen furnace anneal is particularly useful when the CVD-formed film has significant oxygen deficiency. In addition to the advantages mentioned above, steps 140 through 150 of treating the thin film in general provide films of better stoichiometry than films that are not so treated. The ion implantation step 140, the furnace anneal step 150 and the RTP step 145 are preferably performed after removing the substrate from the enclosed deposition chamber. In step 155, if the resulting dried film is not of the desired thickness, then steps 130 and 135 are repeated until the desired thickness is attained. Once the desired thickness of the superlattice thin film material is achieved, then the thin film material is annealed. In step 160, the electrode 410, or other contact layer in the case of other embodiments, is then formed by sputtering or other suitable process. The anneal step 165 is preferably performed in oxygen at a temperature of 650° C. or lower for a time of from 15 minutes to 2 hours, and preferably for about 30 minutes. The anneal step 145 preferably occurs in an oxygen atmosphere in an 80 minute push/pull process including 5 minutes for the "push" into the furnace and 5 minutes for the "pull" out of the furnace. The indicated anneal times include the time that is used to create thermal ramps into and out of the furnace. The film formed in step 130 contains all of the elements of the desired metal oxide, in particular a layered superlattice material, and generally contains most but not all of the oxygen necessary to form the final desired material. It also may contain other organics from the precursor. It may be in an amorphous form, in a partially crystallized form, or in a form with different crystallization than the final form desired. The furnace anneal is performed at a temperature of 650° C. or lower. Finally, in step 170, the integrated circuit device is completed and evaluated. The completion may entail the deposition of additional layers, ion etching of contact holes, and other conventional procedures, as will be understood by those skilled in the art.

Figure 2:
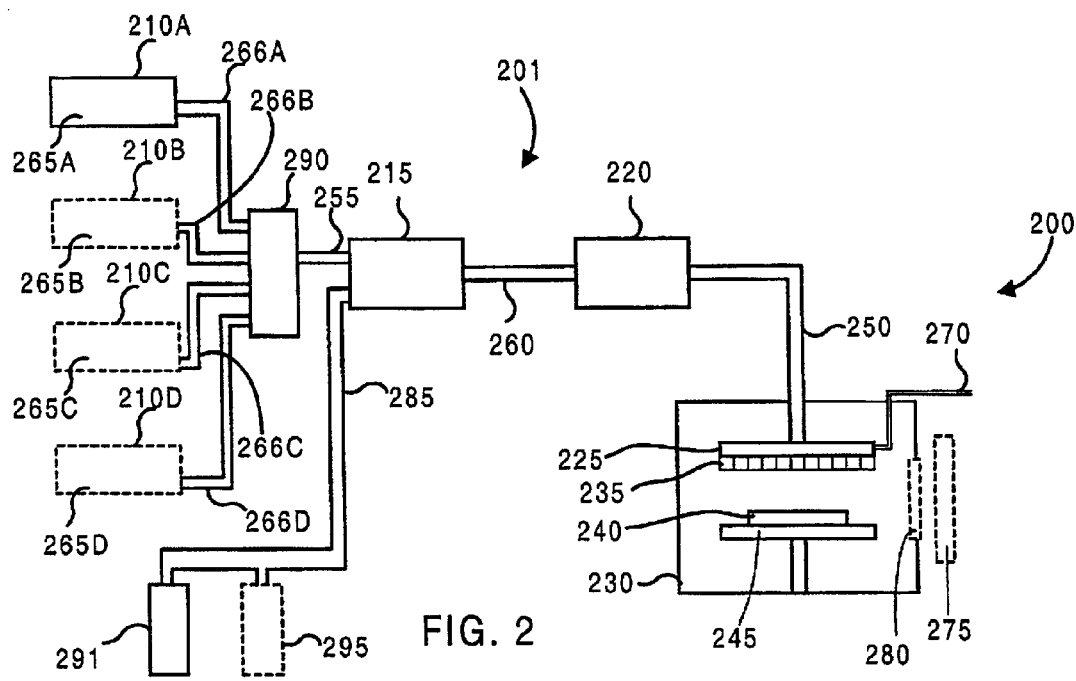
FIG. 2 is a block diagram of the preferred embodiment of the CVD system according to the invention.

FIG. 2 is a block diagram of the preferred embodiment of the CVD system 200 according to the invention. In FIG. 2, precursor container 210A contains precursor solution 265 that may or may not be heated. It is preferred that all precursor compounds, including additives, be mixed in one common solvent that can be safely stored without reaction or decomposition for long periods of time. If that is possible, then there will be only one liquid precursor solution 265A and only one precursor container 210A. If, for example, the material being made is a Bi-layered superlattice material, there will be a container 210A for the trimethylbismuth precursor 265A and a separate container for the metal compound 265B, then the metal compound 265B can be stored in optional container 210B, containing all of the elements in the formula for forming the Bi-layered superlattice material. In some instances, there can be a common solvent, but it must be mixed "on the fly" just prior to atomizing. In this case, the common solvent 265C required for the Bi-layered superlattice material requires a separate container, then the Bi-layered superlattice material can be stored in optional container 210C. In that case, there will be two or more liquid precursor containers 265B, 265C, 265D. The mixing manifold 290 is supplied the precursor solutions from precursor solution container 210A via supply pipe 266A. The optional precursor solution containers 265B, 265C, 265D supply the mixing manifold 290 via supply pipes 266B, 266C, 266D, respectively.

In the preferred embodiment of the invention is a combination 201 of the atomizer 215 and vaporizer 220 of the CVD system 200 according to the invention. Precursor solution container 210A contains a mixture of trimethylbismuth, metal compound and organic solvent. It is also possible that precursor solution container 210A contains just trimethylbismuth and container 210B contains metal compound and solution container 210C contains an organic solvent. Either a mixture of trimethylbismuth, metal compound and organic solvent or trimethylbismuth, metal compound and organic solvent separately are supplied to mixer 290. The trimethylbismuth, metal compound and organic solvent are combined and mixed in mixer 290. The temperature of the process streams being mixed is controlled to avoid premature decomposition, on the one hand, and to avoid condensation of reagent vapors, on the other.

Figure 3:
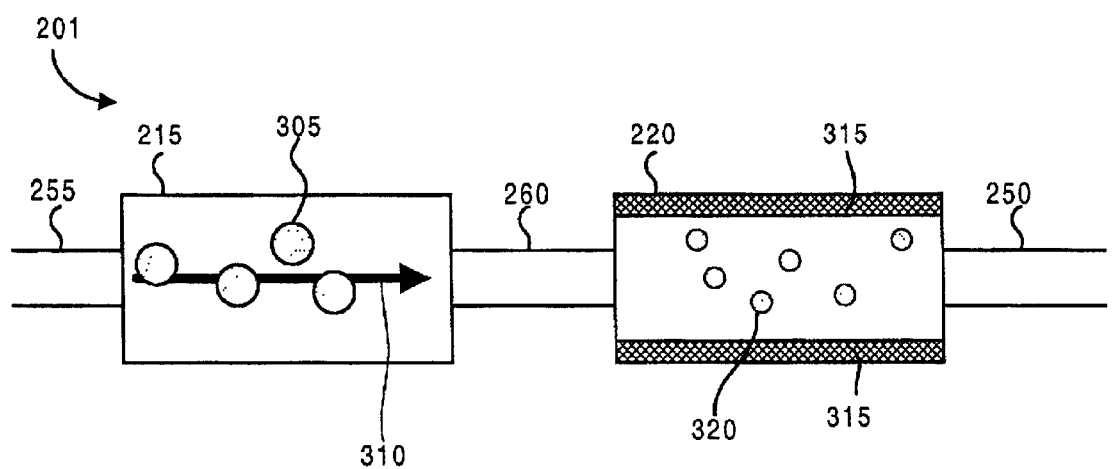
FIG. 3 is a block diagram of the preferred embodiment of the atomizer and vaporizer of the CVD system according to the invention.

FIG. 3 is a block diagram of the preferred embodiment of the combination 201 of the atomizer 215 and vaporizer 220 of the CVD system 200 according to the invention. Atomizer 215 shows precursor aerosol 305 in contact with optional inert carrier gas 310. Precursor aerosol 305 is supplied to atomizer 220 via supply pipe 260. Atomizer 220 contains heaters 315 that heat precursor aerosol 305 to a precursor vapor 320.

A stream of carrier gas 291, such as nitrogen and argon, is supplied to atomizer 215 via supply pipe 285. Carrier gas 291 mixes with precursor solution 265A which creates a mist of small liquid droplets of precursor solution 265A in carrier gas 291. The precursor solution mist exits atomizer 215 as a precursor aerosol 305. Alternatively, precursor solution 265 is supplied to atomizer 215 as a precursor liquid and combines with an inert gas source 291, supplied to atomizer 215 via supply pipe 285, and exits atomizer 215 as a precursor solution aerosol 305.

The inert gas supply may be more than one supply, as noted in the optional gas supply 295. Atomizer 215 is a device that is well-known in the art that produces a mechanical subdivision of the precursor solution, as by spraying, sprinkling, misting or nebulizing. Precursor aerosol 305 is supplied to vaporizer 220 via supply pipe 260. Atomizer 215 reduces the particle size of the precursor mist to less than a few microns. Vaporizer 220 heats precursor aerosol 305 to a precursor vapor 320. Precursor vapor 320 is supplied to mixer 225 via supply pipe 250. Mixer 225 is capable of mixing the optional supply of oxygen supplied via supply pipe 270 with precursor vapor 320 prior to deposition in the enclosed deposition chamber 230. Precursor vapor 320 flows through shower nozzle 235 towards substrate 240, where it decomposes to form the desired thin film. Substrate 240 is adjacent to a heater 245 in the enclosed deposition chamber 230. Optional window 280 allows ultraviolet light from optional ultraviolet light source 275 to enter into the enclosed deposition chamber 230. In this device, while the precursor vapor and oxygen are applied to the surface of substrate 240, ultraviolet light rays are irradiated thereon. As a result, decomposition of the precursor vapor is accelerated and the Bi-layered superlattice material can grow at a lower temperature. A more complete CVD system is included in U.S. Pat. No. 6,110,531, which is hereby incorporated by reference to the same extent as if fully set forth herein.

Figure 4:
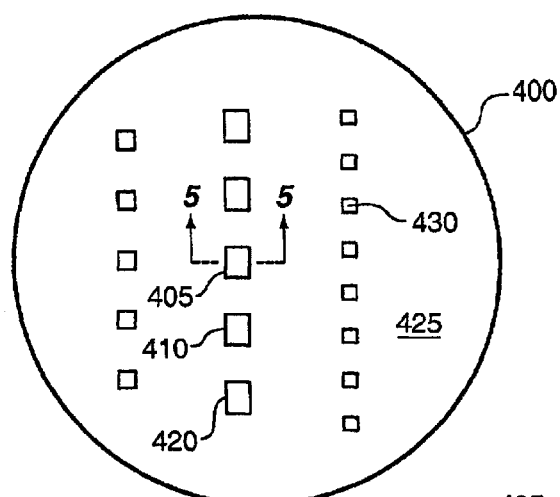
FIG. 4 is a top view of a wafer on which thin film capacitors fabricated by the process according to the invention are shown greatly enlarged.
Figure 5:
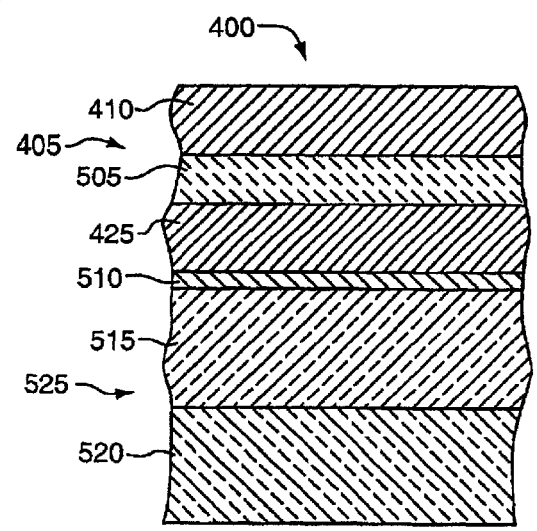
FIG. 5 is a portion of a cross-section of FIG. 4 taken through lines 5—5, illustrating a thin film capacitor device fabricated by the process according to the invention.

Directing attention to FIGS. 4 and 5, a substrate 400 containing numerous capacitors 430, 420, 405, etc., is shown. FIG. 4 is a top view of substrate 400 on which thin film capacitors 430, 420, 405, etc., fabricated by the process according to the invention are shown greatly enlarged. FIG. 5 is a portion of a cross-section of FIG. 4 taken through lines 5—5 bisecting capacitor 405. Referring to FIG. 5, substrate 400 includes silicon substrate 520, silicon dioxide insulating layer 515, a thin layer of titanium 510 which assists the next layer, which is a platinum electrode 425, in adhering to silicon dioxide 515, a layer of layered superlattice material 505, and another platinum electrode 410. After layers 515, 510, 425, 505, and 410 are deposited, the wafer is etched down to layer 425 to form individual capacitors 430, 420, 405, etc., which are interconnected by bottom electrode 425. The invention primarily involves the method of creating layer 505 of layered superlattice material.

Figure 6:
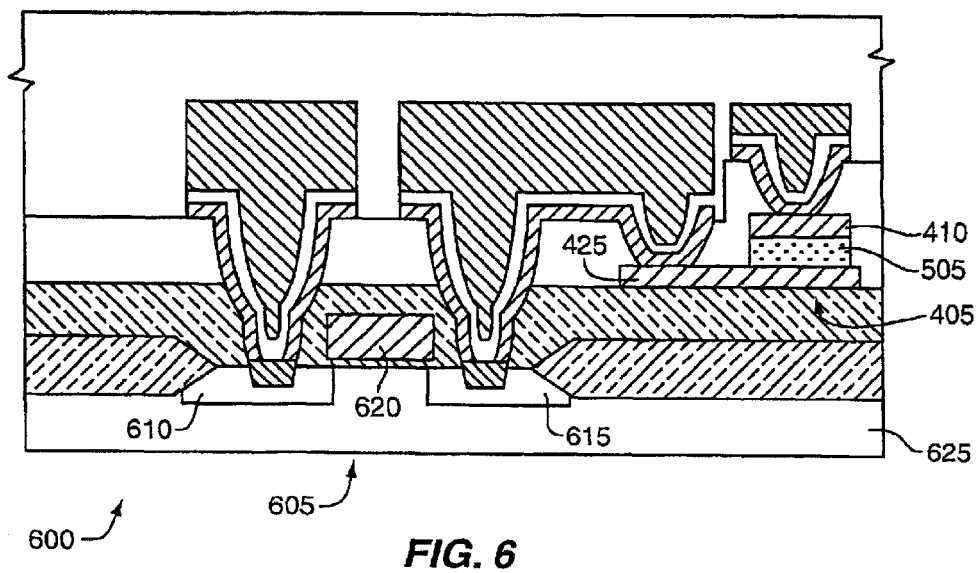
FIG. 6 shows a cross-sectional view of an integrated circuit fabricated by the process according to the invention.

FIG. 6 shows a cross-sectional view of an integrated circuit 600 fabricated by the process according to the invention. It should be understood that the figures depicting the integrated circuit are not meant to be actual cross-sectional views of any particular portion of an actual semiconducting device, but are merely idealized representations which are employed to more clearly and fully depict the structure and process of the invention than would otherwise be possible. The portion of integrated circuit 600 shown represents one dynamic random access memory (DRAM) memory cell which includes a transistor 605 and a capacitor 405. Integrated circuit 600 includes a substrate 625, preferably a single crystal silicon wafer, on which transistor 605 is formed. Transistor 605 comprises source/drain active areas 610 and 615, formed by doping areas of substrate 625, and gate 620. Capacitor 405 includes first electrode 425, layered superlattice material layer 505, and second electrode 410.

EXAMPLE 1

As an example of the process of the invention, substrate 240 is prepared at a temperature of 645° C. in a diffusion furnace for 30 minutes with an oxygen flow of 6 liters/minute.

Then a thin film of precursor solution 265A is prepared using 8 mole percent of trimethylbismuth, 0.4 mole percent of strontium tantalum ethoxide $Sr(Ta(OEt_6)_2$, and 91.6 mole percent of tetrahydrofuran. Precursor solution 265A is mixed and stored in precursor container 210A. Precursor solution 265A is then fed to the mixing manifold 290 at a rate of 450 cubic centimeters per minute. Precursor solution 265A is then fed to atomizer 215, which operates at ambient temperature to create an aerosol. The flow rate of a nitrogen carrier gas 310 to atomizer 215 is 1.5 liters per minute. Precursor aerosol 305 in carrier gas 310 flows through supply pipe 260 at ambient temperature to heaters 315 in vaporizer 220 of CVD system 200 where it is gasified at a pressure of 10 milliTorr and a temperature of 150° C. Precursor vapor 320 and carrier gas 310 flow into mixer 225, where they are mixed with oxygen gas supplied via supply pipe 270. The reactant gas mixture containing oxygen, carrier gas 310 and precursor vapor 320 flows through shower nozzle 235 into enclosed deposition chamber 230. Enclosed deposition chamber 230 is a cold-wall reactor (not heated). It is operated at 10 milliTorr pressure. Substrate 240 is a platinum-coated silicon wafer. It is heated to a temperature of about 500° C. by heater 245, at which temperature decomposition of precursor vapor 320 by pyrolysis and deposition of a thin film on substrate 240 occurs. The decomposition reaction is enhanced by ultraviolet light source 275 entering into enclosed deposition chamber 230 via optional window 280. The chemical deposition reaction is completed in about 10 minutes. With an anneal step 150 at a temperature of 645° C. in an oxygen flow of about 6 liters per minute for 30 minutes, a strontium bismuth tantalate $(SrBi_2Ta_2O_9)$ film of good electrical properties with a final thickness of 1400 may be formed.

The deposition reactor is preferably a conventional, cold-walled PE-MOCVD reactor, though reactors with heated walls may also be used. It is a feature of the invention that, after depositing by CVD, the layered superlattice material is treated to crystallize it in a phase including more grains with a high polarizability orientation than prior to said step of treating. Here, a "high polarizability orientation" means that the grains are oriented in such a way that a field normal to the surface of the substrate will produce a higher polarizability than if the treatment had not been performed. As indicated above, the treatment may comprise RTP, oxygen furnace annealing, ion implantation, a second anneal after the contact to the layered superlattice material is formed, or combinations thereof.

There has been described what at present is considered to be the preferred embodiment of the invention. It should be understood that the invention can be embodied in other specific forms without departing from its spirit or essential characteristics. The present embodiment is, therefore, to be considered as illustrative and not restrictive. Those skilled in the art will recognize that alternate systems may be designed that infringe this invention as set forth in the claims below either literally or through the Doctrine of Equivalents.

What is claimed is:

1. A m thod of making a thin film layered superlattice material on an integrated circuit substrate using trimethylbismuth, said method comprising the steps of:

dissolving said trimethylbismuth and a metal compound in a solvent to produce a final precursor liquid;

forming a mist of said final precursor liquid with a carrier gas to produce a precursor mist;

vaporizing said precursor mist to produce a precursor vapor;

providing said integrated circuit substrate;

applying said precursor vapor onto said substrate to produce said thin film superlattice material without any heating step that includes a temperature of 650° C. or higher; and completing the fabrication of said integrated circuit to include at least a portion of said thin film layered superlattice material in a component of said integrated circuit.

2. A method as in claim 1 wherein said step of dissolving said trimethylbismuth comprises mixing said trimethylbismuth with an organic solvent.

3. A method as in claim 2 wherein said organic solvent comprises at least one compound selected from the group consisting of tetrahydrofuran, methyl ethyl ketone, isopropanol, methanol, xylene, n-butyl acetate, octane, 2-methoxyathanol, toluene, diethylethane, 1,4-dioxane and hexane.

4. A method as in claim 1 wherein said metal compound comprises a metal polyalkoxide compound containing at least two metals selected from the group consisting of strontium, calcium, barium, cadmium, lead, tantalum, hafnium, tungsten, niobium, zirconium, bismuth, scandium, yttrium, lanthanum, antimony, chromium, molybdenum, vanadium, ruthenium and thallium.

5. A method as in claim 1 wherein said metal compound comprises a diketonate compound containing at least two metals selected from the group consisting of strontium, calcium, barium, cadmium, lead, tantalum, hafnium, tungsten, niobium, zirconium, scandium, yttrium, lanthanum, antimony, chromium, molybdenum, vanadium, ruthenium and thallium.

6. A method as in claim 1 wherein said metal compound comprises an oxide Compound containing at least two metals selected from the group consisting of strontium, calcium, barium, cadmium, lead, tantalum, hafnium, tungsten, niobium, zirconium, scandium, yttrium, lanthanum, antimony, chromium, molybdenum, vanadium, ruthenium and thallium.

7. A method as in claim 1 in which the amount of trimethylbismuth is less than 15 mol %.

8. A method as in claim 1 in which the amount of trimethylbismuth is less than 10 mol %.

9. A method as in claim 1 in which the amount of trimethylbismuth is 8 mol %.

10. A method as in claim 1 wherein said step of forming a mist of said precursor liquid comprises flowing said carrier gas across an open throat of a tube containing said precursor liquid, with the flow of said gas being substantially parallel to said open throat.

11. A method as in claim 1 and further including a step of flowing oxygen gas into said deposition chamber reactor prior to said step of reacting.

12. A method as in claim 1 and further comprising at least one step of treating said thin film at temperatures below 650° C. to crystallize or partially crystallize said superlattice material in a phase including more grains with a high polarizability orientation than prior to said at least one step of treating, whereby said at least one step of treating is RTP, oxygen furnace annealing prior to formation of an electrode or contact to said layered superlattice material thin film, or an anneal after an electrode or other contact to the superlattice material thin film is formed.

13. A method as in claim 1 wherein said step of mixing said precursor mist comprises mixing said precursor mist with an inert carrier gas.

14. A method as in claim 1 wherein said carrier gas comprises at least one compound selected from the group consisting of nitrogen and argon.

15. A method as in claim 1 wherein said step of vaporizing comprises heating said precursor aerosol prior to said deposition step.

16. A method as in claim 15 wherein said step of heating further comprises heating said precursor aerosol to a temperature of from 50° C. to 250° C.

17. A method as in claim 15 wherein said step of heating further comprises heating said precursor aerosol to a temperature of from 100° C. to 200° C.

18. A method as in claim 1 wherein said step of providing said substrate further comprises placing said substrate inside a deposition chamber.

19. A method as in claim 18 wherein said step of applying said precursor vapor comprises chemical vapor deposition.

20. A method as in claim 1 wherein said step of applying said precursor vapor further comprises deposition on a heated substrate.

21. A method as in claim 1 wherein said step of applying said precursor vapor further comprises deposition on an ambient temperature substrate.

22. A method as in claim 1 wherein the thin film layered superlattice material is 1 nm to 100 nm thick.

23. A method of making a thin film layered superlattice material on an integrated circuit substrate using trimethylbismuth, said method comprising the steps of:

dissolving said trimethylbismuth and a metal compound in a solvent to produce a precursor liquid, with the relative concentration of said trimethylbismuth to said solvent being 15 mol % or less;

forming a mist of said precursor liquid with a carrier gas to produce a precursor mist;

vaporizing said precursor mist to produce a precursor vapor;

providing said integrated circuit substrate;

applying said precursor vapor onto said substrate to produce said thin film superlattice material without any heating step that includes a temperature of 650° C. or higher; and completing the fabrication of said int grat d circuit to include at least a portion of said thin film layered superlattice material in a component of said integrated circuit.

* * * * *